United States Patent
Ueng et al.

(10) Patent No.: US 8,650,452 B2
(45) Date of Patent: Feb. 11, 2014

(54) NON-BINARY QC-LDPC CODE DECODING DEVICE AND ASSOCIATED METHOD

(75) Inventors: Yeong-Luh Ueng, Hsinchu (TW); Chung-Jay Yang, Hsinchu (TW); Chen-Yap Leong, Hsinchu (TW); Kuo-Hsuan Liao, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 150 days.

(21) Appl. No.: 13/436,995

(22) Filed: Apr. 2, 2012

(65) Prior Publication Data
US 2013/0173981 A1 Jul. 4, 2013

(30) Foreign Application Priority Data
Jan. 4, 2012 (TW) .............................. 101100275 A

(51) Int. Cl.
*H03M 13/00* (2006.01)
(52) U.S. Cl.
USPC ........................................ 714/752
(58) Field of Classification Search
None
See application file for complete search history.

(56) References Cited

U.S. PATENT DOCUMENTS

| 6,715,121 B1 | 3/2004 | Laurent | |
|---|---|---|---|
| 8,516,347 B1 * | 8/2013 | Li et al. | 714/780 |
| 2010/0179975 A1 * | 7/2010 | Liao et al. | 708/209 |
| 2011/0252286 A1 * | 10/2011 | Li et al. | 714/755 |

OTHER PUBLICATIONS

Low-complexity entirely-overlapped parallel decoder architecture for quasi-cyclic LDPC codes Weizhi Lu—Piming Ma—Advanced Communication Technology, 2009. ICACT 2009. 11th International Conference on vol. 02—Publication Year: 2009 , pp. 969-973.*
Efficient Configurable Decoder Architecture for Nonbinary Quasi-Cyclic LDPC Codes—Xiaoheng Chen ; Shu Lin ; Akella, V. Circuits and Systems I: Regular Papers, IEEE Transactions on vol. 59 , Issue: 1—Publication Year: 2012 , pp. 188-197.*

* cited by examiner

*Primary Examiner* — Guerrier Merant
(74) *Attorney, Agent, or Firm* — Ming Chow; Sinorica, LLC

(57) ABSTRACT

A non-binary quasi-cyclic (QC) low-density parity-check (LDPC) code decoding device comprises a first barrel-shifter, a routing network and a second barrel-shifter. The first barrel-shifter uses a constraint $h'v'+h''v''=hv$ to shift $q-1$ elements of an input by $j_0$ positions to produce first temporary elements. The routing network connects to the first barrel-shifter, permutes the first temporary elements to produce second temporary elements if $v'$ of the constraint is not zero and designates the first temporary elements as the second temporary elements if $v'$ of the constraint is zero. The second barrel-shifter connects to the routing network and uses the constraint $h'v'+h''v''=hv$ to shift $q-1$ elements of the second temporary elements by $i_0$ positions. A non-binary QC-LDPC decoding method is also disclosed.

6 Claims, 2 Drawing Sheets

NON-BINARY QC-LDPC CODE DECODING DEVICE AND ASSOCIATED METHOD

The current application claims a foreign priority to the patent application of Taiwan No. 101100275 filed on Jan. 4, 2012.

FIELD OF THE INVENTION

The present invention is a non-binary quasi-cyclic (QC) low-density parity-check (LDPC) code decoding device and associated method.

BACKGROUND OF THE INVENTION

In information theory, a low-density parity-check (LDPC) code is a linear error correcting code and a method of transmitting a message over a noisy transmission channel and is constructed using a sparse bipartite graph. LDPC codes are capacity-approaching codes, which means that practical constructions exist that allow a noise threshold to be set very close to a theoretical maximum for a symmetric memory-less channel. The noise threshold defines an upper bound for the channel noise, up to which the probability of lost information can be made as small as desired. Using iterative belief propagation techniques, LDPC codes can be decoded in time linear to their block length.

U.S. Pat. No. 6,715,121 discloses a process for the construction of LDPC codes including N symbols, can adapt to non-binary codes, of which K are free, each code being defined by a check matrix A including M=N−K rows, N columns, and t nonzero symbols in each column. The method includes allocating the same number of nonzero symbols to all rows of the check matrix A, taking t to be the smallest possible odd number, defining the columns of A such that any two columns of the check matrix A have at most one nonzero value in a common position, and defining the rows of A such that any two rows of the check matrix A have only one nonzero value in a common position.

However, the process for the construction of LDPC codes adapting to non-binary codes has high decoding complexity and is accomplished with difficulty in hardware.

Accordingly, a new decoding device for non-binary QC-LDPC codes and associated method that has low decoding complexity and is accomplished easily in hardware are needed to overcome the foregoing problems.

SUMMARY OF THE INVENTION

A main objective of the present invention is to provide a non-binary QC-LDPC code decoding device and associated method has low decoding complexity and is accomplished easily in hardware.

A non-binary QC-LDPC code decoding device in accordance with the present invention has low decoding complexity, is accomplished easily in hardware, has an input in QC-LDPC code, obeys a constraint $h'v'+h''v''=hv$ and comprises a first barrel-shifter, a routing network and a second barrel-shifter.

The input is a log-likelihood ratio vector that has q elements, and every element is represented for numbers using only $\log_2(q)$ binary bits.

q is a positive integer that greater than 1. The parity-check matrix H is related to a finite field GF(q) and defines the constraint $h'v'+h''v''=hv$. According to the constraint $h'v'+h''v''=hv$, defines $i_0$ and $j_0$ to control the behavior of the first barrel-shifter, the routing network and the second barrel-shifter, h, h', h'' are non-zero elements, v, v', v'' are code symbols that relate to elements of the finite field GF(q) and are presented by non-binary quasi-cyclic (QC) low-density parity-check (LDPC) codes.

The first barrel-shifter uses the constraint $h'v'+h''v''=hv$ to shift q−1 elements of the input by $j_0$ positions to produce a first temporary element.

The routing network connects to the first barrel-shifter, permutes the first temporary elements to produce second temporary elements if v' of the constraint is not zero and designates the first temporary elements as the second temporary elements if v' of the constraint is zero.

The second barrel-shifter connects to the routing network and uses the constraint $h'v'+h''v''=hv$ to shift q−1 elements of the second temporary elements by $i_0$ positions.

A non-binary QC-LDPC code decoding method in accordance with the present invention has low decoding complexity, is accomplished easily in hardware, has an input in QC-LDPC code and obeys a constraint $h'v'+h''v''=hv$.

The input is a log-likelihood ratio vector that has q elements, and every element is represented for numbers using only $\log_2(q)$ binary bits.

q is a positive integer that greater than 1. The parity-check matrix H is related to a finite field GF(q) and defines the constraint $h'v'+h''v''=hv$. According to the constraint $h'v'+h''v''=hv$, defines $i_0$ and $j_0$ to control the behavior of the first barrel-shifter, the routing network and the second barrel-shifter, h, h', h'' are non-zero elements, v, v', v'' are code symbols that relate to the elements of the finite field GF(q) and are presented by non-binary quasi-cyclic (QC) low-density parity-check (LDPC) codes.

The non-binary QC-LDPC code decoding method comprises steps of using the constraint $h'v'+h''v''=hv$ to shift q−1 elements of the input by $j_0$ positions to produce first temporary elements, determining whether v' of the constraint is zero, permuting the first temporary elements to produce second temporary elements if v' of the constraint is not zero, designating the first temporary elements as the second temporary elements if v' of the constraint is zero, and using the constraint $h'v'+h''v''=hv$ to shift q−1 elements of the second temporary elements by $i_0$ positions.

DETAILED DESCRIPTION OF THE PRESENT INVENTION

Figure 1:
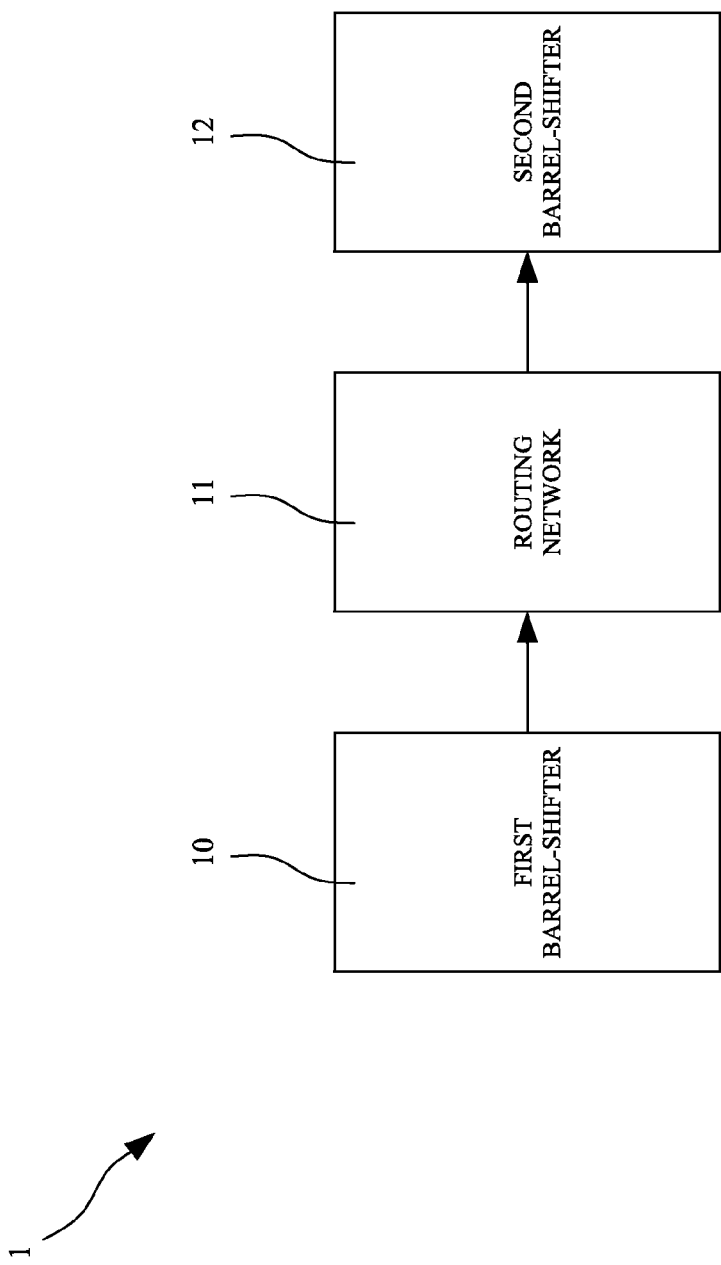
FIG. 1 is a block diagram of a non-binary quasi-cyclic (QC) low-density parity-check (LDPC) code decoding device in accordance with the present invention.

With reference to FIG. 1, a non-binary quasi-cyclic (QC) low-density parity-check (LDPC) code decoding device (1) in accordance with the present invention has low decoding complexity and is easy to be implemented in hardware, has an input and a first embodiment obeys a constraint $h'v'+h''v''=hv$ and comprises a first barrel-shifter (10), a routing network (11) and a second barrel-shifter (12).

The input is a log-likelihood ratio vector that has q elements, and every element is represented for numbers using only $\log_2(q)$ binary bits.

q is a positive integer that greater than 1. The parity-check matrix H is related to a finite field GF(q) and defines the constraint $h'v'+h''v''=hv$. According to the constraint $h'v'+$ h"v"=hv, defines $i_0$ and $j_0$ to control the behavior of the first barrel-shifter, the routing network and the second barrel-shifter.

The constraint h'v'+h"v"=hv can be rewritten to $v=\alpha^{r1-r0}v'+\alpha^{r2-r0}v''$, equals $v=\alpha^{r1-r0+s1}(1+\alpha^{r2-r0-s1}v'')$ if v' is not equal to 0, and equals $v=\alpha^{r2-r0}v''$ if v' is equal to 0.

h, h', h" are non-zero elements. In one embodiment, $h=\alpha^{r0}$, $h'=\alpha^{r1}$, $h''=\alpha^{r2}$, r0, r1 and r2 belong to a positive integer group of 0 and 1 to q−2, $v'=\alpha^{s1}$, s1 belong to another positive integer group of 0 and 1 to q−2. v, v', v" are code symbols that relate to elements of the finite field GF(q) and are presented by non-binary quasi-cyclic (QC) low-density parity-check (LDPC) codes.

The first barrel-shifter (10) uses the constraint h'v'+h"v"=hv to shift q−1 elements of the input by $j_0$ positions to produce first temporary elements.

The routing network (11) connects to the first barrel-shifter (10), permutes the first temporary elements to produce second temporary elements if v' of the constraint is not zero and designates the first temporary elements as the second temporary elements if v' of the constraint is zero.

The second barrel-shifter (12) connects to the routing network and uses the constraint h'v'+h"v"=hv to shift q−1 elements of the second temporary elements by $i_0$ positions.

The first embodiment has a symbol location vector S, q=4, the symbol location vector S has four input elements and is built up by a finite field GF(4) and a primitive polynomial $1+X+X^2$.

The finite field GF(4) has four elements that are $1=\alpha^0$, $\alpha$, $\alpha^2=1+\alpha$ and 0. If v'=0, the four input elements of the symbol location vector S are $\alpha^{i0}(\alpha^0)$, $\alpha^{i0}(\alpha^1)$, $\alpha^{i0}(\alpha^2)$, 0, $i_0=r_2-r_0$.

$$S = \begin{bmatrix} \alpha^{i0}(\alpha^0) \\ \alpha^{i0}(\alpha^1) \\ \alpha^{i0}(\alpha^2) \\ 0 \end{bmatrix}$$

If v' does not equal 0 and equals $\alpha^{s1}$, the four input elements of the symbol location vector S are changed to $\alpha_{i0}(1+\alpha^{j0})$, $\alpha^{i0}(1+\alpha^{j0+1})$, $\alpha^{i0}(1+\alpha^{j0+2})$, $\alpha^{i0}(1+0)$, $i_0=r_1-r_0+s_1$, $j_0=r_2-r_1-s_1$.

$$S = \begin{bmatrix} \alpha^{i0}(1+\alpha^{j0}) \\ \alpha^{i0}(1+\alpha^{j0+1}) \\ \alpha^{i0}(1+\alpha^{j0+2}) \\ \alpha^{i0}(1+0) \end{bmatrix}$$

If $i_0=2$ and $j_0=1$, the four input elements of the symbol location vector S are changed to $\alpha^2(1+\alpha)$, $\alpha^2(1+\alpha^2)$, $\alpha^2(1+\alpha^0)$, $\alpha^2(1+0)$, wherein $j_0$ is an integer in a range from 0 to (4−2), $j_0+2=0$.

$$S = \begin{bmatrix} \alpha^2(1+\alpha) \\ \alpha^2(1+\alpha^2) \\ \alpha^2(1+\alpha^0) \\ \alpha^2(1+0) \end{bmatrix}$$

The first barrel-shifter (10) shifts q−1=3 elements of the symbol location vector S by $j_0=1$ positions. The four input elements of the symbol location vector S are changed to $\alpha^2(1+\alpha^0)$, $\alpha^2(1+\alpha)$, $\alpha^2(1+\alpha^2)$, $\alpha^2(1+0)$.

$$S = \begin{bmatrix} \alpha^2(1+\alpha^0) \\ \alpha^2(1+\alpha) \\ \alpha^2(1+\alpha^2) \\ \alpha^2(1+0) \end{bmatrix}$$

The symbol location vector S is input to the routing network (11) for permuting the four input elements of the symbol location vector S. The four input elements of the symbol location vector S are changed to $\alpha^2 \cdot \alpha^0$, $\alpha^2 \cdot \alpha^1$, $\alpha^2 \cdot \alpha^2$, $\alpha^2 \cdot 0$.

$$S = \begin{bmatrix} \alpha^2 \cdot \alpha^0 \\ \alpha^2 \cdot \alpha^1 \\ \alpha^2 \cdot \alpha^2 \\ \alpha^2 \cdot 0 \end{bmatrix}$$

The symbol location vector S is input to the second barrel-shifter (12) and shifts q−1 elements of the symbol location vector S by $i_0=2$ positions. The four input elements of the symbol location vector S are changed to $\alpha^0$, $\alpha^1$, $\alpha^2$, 0.

$$S = \begin{bmatrix} \alpha^0 \\ \alpha^1 \\ \alpha^2 \\ 0 \end{bmatrix}$$

Figure 2:
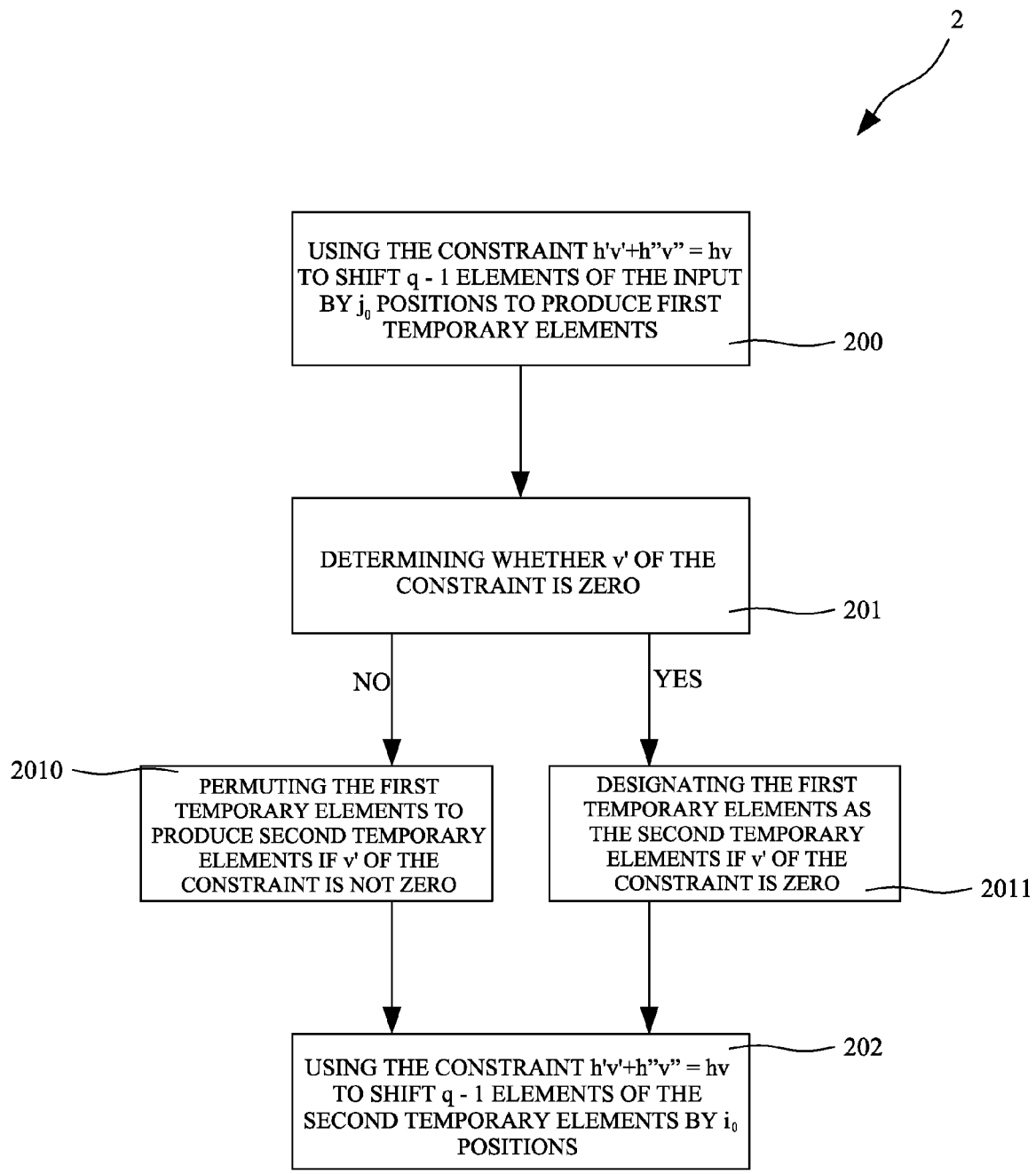
FIG. 2 is a flowchart of a non-binary quasi-cyclic (QC) low-density parity-check (LDPC) code decoding method in accordance with the present invention.

With further reference to FIG. 2, a non-binary quasi-cyclic (QC) low-density parity-check (LDPC) code decoding method (2) in accordance with the present invention has low decoding complexity, is easy to present in hardware, has an input and obeys a constraint h'v'+h"v"=hv.

The input is a log-likelihood ratio vector that has q elements, and every element is represented for numbers using only $\log_2(q)$ binary bits.

q is a positive integer that greater than 1. According to the constraint h'v'+h"v"=hv, defines $i_0$ and $j_0$ to control the behavior of the first barrel-shifter (10), the routing network (11) and the second barrel-shifter (12).

The constraint h'v'+h"v"=hv can be rewritten to $v=\alpha^{r1-r0}v'+\alpha^{r2-r0}v''$, equals $v=\alpha^{r1-r0+s1}(1+\alpha^{r2-r0-s1}v'')$ if v' is not equal to 0, and equals $v=\alpha^{r2-r0}v''$ if v' is equal to 0.

h, h', h" are non-zero elements. In one embodiment, $h=\alpha^{r0}$, $h'=\alpha^{r1}$, $h''=\alpha^{r2}$, r0, r1 and r2 belong to a positive integer group of 0 and 1 to q−2, $v'=\alpha^{s1}$, s1 belong to another positive integer group of 0 and 1 to q−2.

v, v', v" are code symbols that relate to the elements of the finite field GF(q) and are presented by non-binary quasi-cyclic (QC) low-density parity-check (LDPC) codes.

The non-binary QC-LDPC code decoding method (2) comprises steps of (200) using the constraint h'v'+h"v"=hv to shift q−1 elements of the input by $j_0$ positions to produce first temporary elements, (201) determining whether v' of the constraint is zero, (2010) permuting the first temporary elements to produce second temporary elements if v' of the constraint is not zero, (2011) designating the first temporary elements as the second temporary elements if v' of the constraint is zero, and (202) using the constraint h'v'+h"v"=hv to shift q−1 elements of the second temporary elements by $i_0$ positions.

Various changes can be made without departing from the broad spirit and scope of the invention.

What is claimed is:

1. A non-binary quasi-cyclic (QC) low-density parity-check (LDPC) code decoding device obeying a constraint h'v'+h"v"=hv and having an input that is a log-likelihood ratio vector that has q elements, and every element is represented for numbers using only $\log_2(q)$ binary bits, q is a positive integer that greater than 1, a parity-check matrix H is related to a finite field GF(q) and defines the constraint h'v'+h"v"=hv, according to the constraint h'v'+h"v"=hv, defines $i_0$ and $j_0$ to control the behavior of a first barrel-shifter, a routing network and a second barrel-shifter, h, h', h" are non-zero elements, v, v', v" are code symbols that relate to the elements of the finite field GF(q) and are presented by non-binary quasi-cyclic (QC) low-density parity-check (LDPC) codes, and comprising a first barrel-shifter using the constraint h'v'+h"v"=hv to shift q−1 elements of the input by $j_0$ positions to produce first temporary elements; a routing network connecting to the first barrel-shifter, permuting the first temporary elements to produce second temporary elements if v' of the constraint is not zero and designating the first temporary elements as the second temporary elements if v' of the constraint is zero; and a second barrel-shifter connecting to the routing network and using the constraint h'v'+h"v"=hv to shift q−1 elements of the second temporary elements by $i_0$ positions.

2. The non-binary quasi-cyclic (QC) low-density parity-check (LDPC) code decoding device as claimed in claim 1, wherein $h=\alpha^{r0}$, $h'=\alpha^{r1}$, $h"=\alpha^{r2}$, r0, r1 and r2 belong to a positive integer group of 0 and 1 to q−2, $v'=\alpha^{s1}$, s1 belong to another positive integer group of 0 and 1 to q−2, the constraint h'v'+h"v"=hv can rewrite to $v=\alpha^{r1-r0}v'+\alpha^{r2-r0}v"$.

3. The non-binary quasi-cyclic (QC) low-density parity-check (LDPC) code decoding device as claimed in claim 2, wherein the constraint h'v'+h"v"=hv equals $v=\alpha^{r1-r0+s1}(1+\alpha^{r2-r0-s1}v")$ if v' is not equal to 0, the constraint h'v'+h"v"=hv equals $v=\alpha^{r2-r0}v"$ if v' is equal to 0.

4. A non-binary QC-LDPC decoding method obeying a constraint h'v'+h"v"=hv and having an input that is a log-likelihood ratio vector that has q elements, and every element is represented for numbers using only $\log_2(q)$ binary bits, q is a positive integer that greater than 1, a parity-check matrix H is related to a finite field GF(q) and defines the constraint h'v'+h"v"=hv, according to the constraint h'v'+h"v"=hv, defines $i_0$ and $j_0$ to control the behavior of a first barrel-shifter, a routing network and a second barrel-shifter, h, h', h" are non-zero elements, v, v', v" are code symbol that relates to the elements of the finite field GF(q) and are presented by non-binary quasi-cyclic (QC) low-density parity-check (LDPC) codes, and comprising steps of using the constraint h'v'+h"v"=hv to shift q−1 elements of the input by $j_0$ positions for producing a first temporary elements, determining whether v' of the constraint is zero, permuting the first temporary elements to produce a second temporary elements if v' of the constraint is not zero, designating the first temporary elements as the second temporary elements if v' of the constraint is zero, and using the constraint h'v'+h"v"=hv to shift q−1 elements of the second temporary elements by $i_0$ positions.

5. The non-binary QC-LDPC decoding method as claimed in claim 4, wherein $h=\alpha^{r0}$, $h'=\alpha^{r1}$, $h"=\alpha^{r2}$, r0, r1 and r2 belong to a positive integer group of 0 and 1 to q−2, $v'=\alpha^{s1}$, s1 belong to another positive integer group of 0 and 1 to q−2, the constraint h'v'+h"v"=hv can rewrite to $v=\alpha^{r1-r0}v'+\alpha^{r2-r0}v"$.

6. The non-binary QC-LDPC decoding method as claimed in claim 5, wherein the constraint h'v'+h"v"=hv equal to $v=\alpha^{r1-r0+s1}(1+\alpha^{r2-r0-s1}v")$ if v' is not equal to 0, the constraint h'v'+h"v"=hv equal to $v=\alpha^{r2-r0}v"$ if v' is equal to 0.

* * * * *